(12) United States Patent
Mashiko

(10) Patent No.: US 6,828,793 B2
(45) Date of Patent: Dec. 7, 2004

(54) BATTERY VOLTAGE DETECTING CIRCUIT

(75) Inventor: Takeshi Mashiko, Chiba (JP)

(73) Assignee: Seiko Instruments Inc., Chiba (JP)

(*) Notice: Subject to any disclaimer, the term of this patent is extended or adjusted under 35 U.S.C. 154(b) by 83 days.

(21) Appl. No.: 10/253,831

(22) Filed: Sep. 24, 2002

(65) Prior Publication Data
US 2003/0094954 A1 May 22, 2003

(30) Foreign Application Priority Data
Nov. 21, 2001 (JP) .......................... 2001-355997

(51) Int. Cl.$^7$ .......................................... G01N 27/416
(52) U.S. Cl. .................................. 324/433; 324/432
(58) Field of Search ...................... 324/522, 425–450; 320/134, 118, 128

(56) References Cited

U.S. PATENT DOCUMENTS 4,961,103 A * 10/1990 Saitoh et al. ............... 257/380
5,742,148 A * 4/1998 Sudo et al. ................. 320/134

* cited by examiner

Primary Examiner—Anjan Deb
Assistant Examiner—Donald M. Lair
(74) Attorney, Agent, or Firm—Adams & Wilks

(57) ABSTRACT

To eliminate in structure a parasitic capacity formed between a polycrystalline silicon film resistor and a semiconductor substrate, and to provide a battery voltage detecting circuit capable of surely detecting a battery voltage. A layer such as a well which is insulated from a semiconductor substrate is disposed on the semiconductor substrate just below a polycrystalline silicon film resistor, and a potential of the layer is set to be a stable potential which is not influenced by a potential of the polycrystalline silicon film resistor or a detecting operation of a battery. With this structure, no parasitic capacity is eliminated in structure, thereby being capable of surely detecting the battery voltage.

11 Claims, 2 Drawing Sheets

BATTERY VOLTAGE DETECTING CIRCUIT

BACKGROUND OF THE INVENTION

1. Field of the Invention

The present invention relates to a battery voltage detecting circuit that monitors the respective voltages of at least two batteries which are connected in series.

2. Description of the Related Art

As a known battery voltage detecting circuit that monitors the respective voltages of at least two batteries which are connected in series, there is a battery voltage detecting circuit which is comprised of a voltage dividing circuit, a voltage detecting circuit and a control circuit for outputting a detection result of the detecting circuit as a control signal, as shown in a circuit block diagram of FIG. 2. As the voltage dividing circuit used for the battery voltage detecting circuit, in order to realize a low current consumption at low cost, there is generally employed a polycrystalline silicon film resistor which is high in sheet resistance.

The conventional polycrystalline silicon film resistor is realized by forming an insulating film 2 on a surface of a semiconductor substrate 3, and then forming a polycrystalline silicon film resistor 1 on the insulating film 2, as shown in the structural cross-sectional view of FIG. 3.

In the conventional polycrystalline silicon film resistor shown in FIG. 3, the semiconductor substrate 3 needs to provide the highest potential in the case where the semiconductor substrate 3 is of an n-type and the semiconductor substrate 3 needs to provide the lowest potential in the case where the semiconductor substrate 3 is of a p-type. Therefore, in the battery voltage detecting circuit shown in FIG. 2, a VDD terminal voltage, which is a power supply for the battery voltage detecting circuit, or a VSS terminal voltage, which is a common of the battery voltage detecting circuit is applied to a substrate voltage supply terminal 4, respectively. However, in the polycrystalline silicon film resistor shown in FIG. 3, a parasitic capacity 8 is added between the polycrystalline silicon film resistor 1 and the semiconductor substrate 3 through the insulating film 2. Therefore, in the battery voltage detecting circuit shown in FIG. 2, even if voltages across the batteries 2 and 22 are constant, when a voltage variation occurs at the VDD terminal, which is a power supply, or a VSS terminal, which is a common, the output voltages of the voltage dividing circuits 23 and 24 each of which is comprised of a polycrystalline silicon film resistor vary due to the parasitic capacity 8, and the voltage detecting circuits 25 and 26 react with the varied output voltages, resulting in a problem in that false detection or false release occurs.

SUMMARY OF THE INVENTION

Therefore, in order to solve the above-mentioned problems with the related art, according to the present invention, there is provided a polycrystalline silicon film resistor used in a voltage dividing circuit for a battery voltage detecting circuit. The resistor is provided with a well, which is a layer insulated from a semiconductor substrate, disposed on the semiconductor substrate at a side opposite to the polycrystalline silicon film resistor with an insulating film interposed therebetween. In addition, the potential of the well is set to be the same potential as that of the polycrystalline silicon film resistor or a stable potential. As a result, no parasitic capacity is disposed between the semiconductor substrate and the polycrystalline silicon film resistor, to thereby solve a problem in that false detection or false release is led by a voltage variation at a VDD terminal which is a power supply or a VSS terminal which is a common.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of a preferred embodiment of the present invention with reference to the accompanying drawings.

Figure 1:
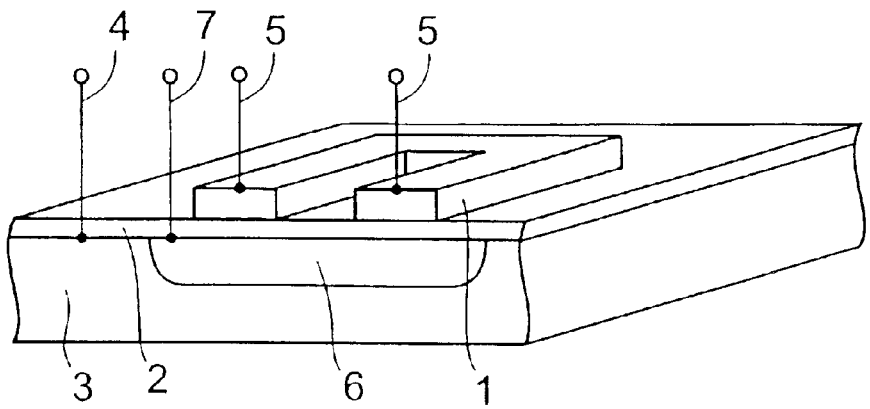
FIG. 1 is a structural cross-sectional view of a polycrystalline silicon film resistor in accordance with the present invention.
Figure 2:
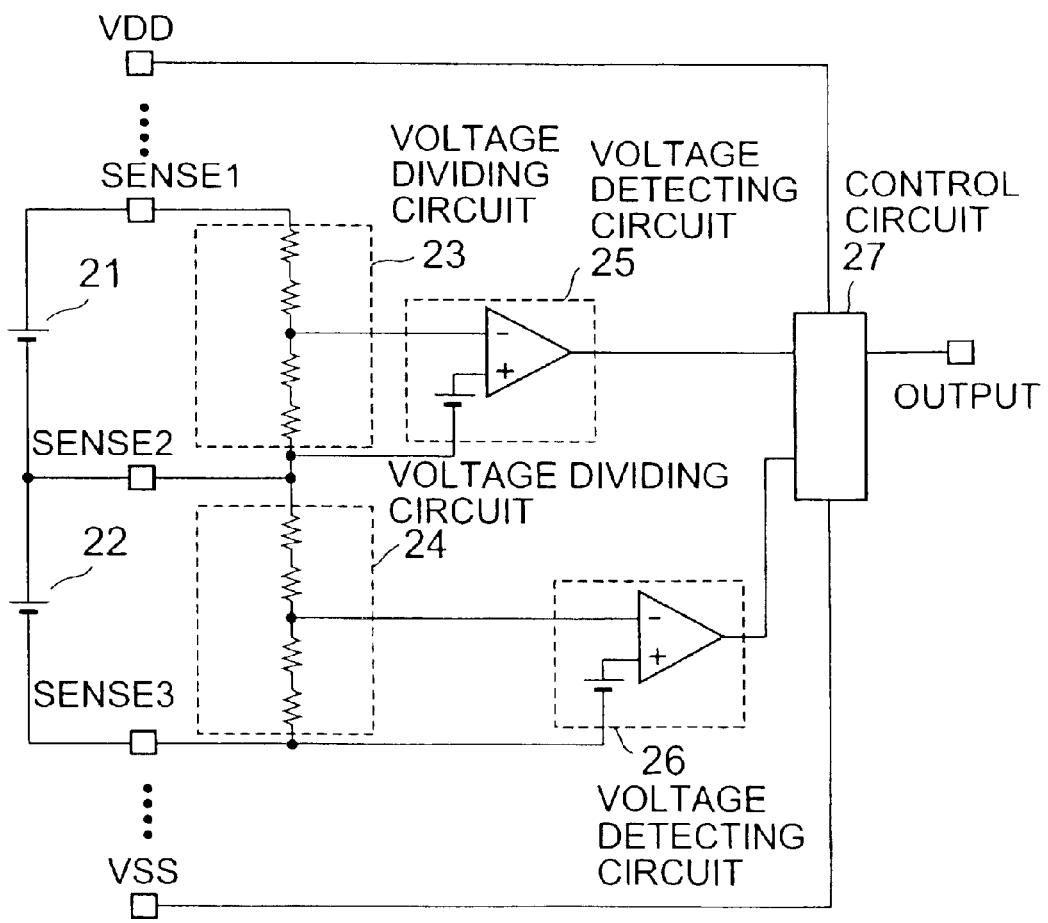
FIG. 2 is a block diagram of a battery voltage detecting circuit which is applied to the present invention.
Figure 3:
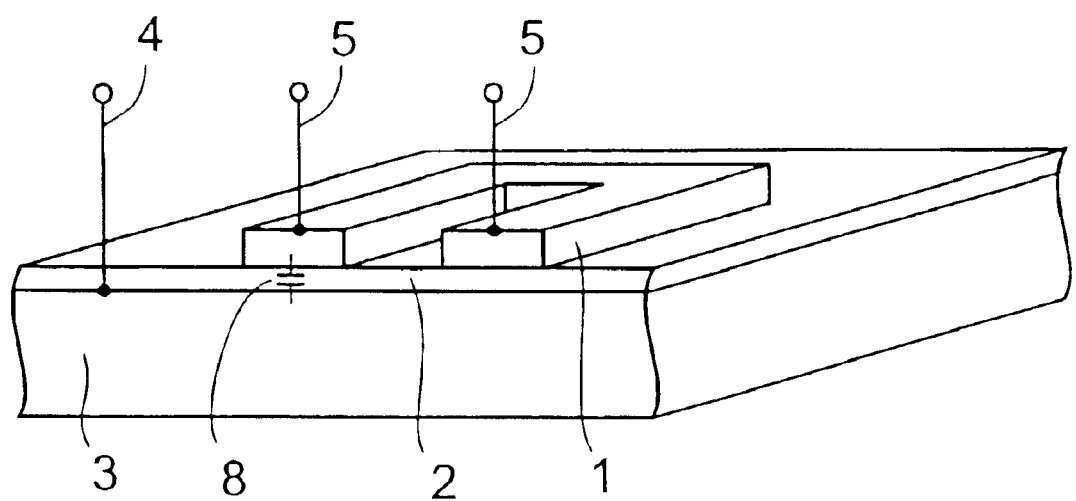
FIG. 3 is a structural cross-sectional view of a conventional polycrystalline silicon film resistor.

FIG. 1 is a structural cross-sectional view of a polycrystalline silicon film resistor in accordance with an embodiment of the present invention. FIG. 2 is a circuit block diagram of a battery voltage detecting circuit in accordance with the embodiment of the present invention. Hereinafter, the embodiment of the present invention will be described with reference to FIGS. 1 and 2.

First, the structure of the battery voltage detecting circuit in accordance with this embodiment will be described with reference to FIG. 2. Voltage dividing circuits 23 and 24 are connected to batteries 21 and 22 which are connected in series, respectively. Then, voltages divided by the voltage dividing circuits 23 and 24, respectively, are monitored by voltage detecting circuits 25 and 26, respectively. The respective voltage detection results are outputted through a control circuit 27 to detect that the voltage across the battery is not a given voltage.

Subsequently, the structure of the polycrystalline silicon film resistor which is used in the voltage dividing circuits 23 and 24 of the battery voltage detecting circuit will be described with reference to FIG. 1. A semiconductor substrate 3 is generally of an n-type or a p-type and is required to provide the highest potential or the lowest potential which is used in the respective circuits. Therefore, a thin insulating film 2 is formed in order to insulate from the potential of the semiconductor substrate 3, and a polycrystalline silicon film resistor 1 is formed on the insulating film 2. The highest potential and the lowest potential of the semiconductor substrate 3 becomes a power supply VDD terminal and a common VSS terminal in the case of the battery voltage detecting circuit shown in FIG. 2.

Subsequently, the embodiment of the present invention will be described more specifically. The voltage dividing circuits 23, 24 and the voltage detecting circuits 25, 26 which are used in FIG. 2 showing the battery voltage detecting circuit are set on the basis of the negative electrodes of the respective batteries 21 and 22. With this structure, any influences other than the variation of the batteries which are detected, respectively, are canceled. However, in general, the polycrystalline silicon film resistors used in the voltage dividing circuits 23 and 24 require a large area in order to increase the resistance value and decrease the current consumption. Also, the insulating film 2 cannot be thickened so much, taking the cost-up into consideration. Therefore, a parasitic capacity which causes a problem is produced between the semiconductor substrate 3 and the polycrystalline silicon film resistor 1. Accordingly, when the power supply VDD voltage or the common VSS voltage varies, because the voltages across the voltage dividing circuits 23 and 24 which are composed of a polycrystalline silicon resistor, respectively, are varied due to the parasitic capacity, the voltage variation of the power supply VDD or the common VSS is adversely affected. According to the present invention, as shown in FIG. 1 which is a structural cross-sectional view of the polycrystalline silicon film resistor, a well 6 which is a p-type impurity layer in the case where the semiconductor substrate 3 is of the n-type and a well 6 which is an n-type impurity layer in the case where the semiconductor substrate 3 is of the p-type is formed on the semiconductor substrate 3 on a side opposite to the polycrystalline silicon film resistor 1 with the insulating film 2 interposed therebetween. In addition, in the case where the voltage dividing circuit 23 is composed of a polycrystalline silicon film resistor, a well voltage supply terminal 7 is connected to a negative electrode of the battery 21, and in the case where the voltage dividing circuit 24 is composed of a polycrystalline silicon film resistor, the well voltage supply terminal 7 is connected to the negative electrode of the battery 22. As a result, the parasitic capacity is almost eliminated between the semiconductor substrate 3 and the polycrystalline silicon film resistor 1, thereby being capable of canceling any influences other than a variation of the batteries which are detected in the battery voltage detecting circuit, respectively.

Incidentally, there is no limit to the number of resistors which are used in the voltage dividing circuits 23 and 24 of the battery voltage detecting circuit shown in FIG. 2, and it is not necessary that a well must be disposed on each of the resistors. Also, it is apparent that the same effect can be obtained even if one well is disposed for a plurality of resistors. In addition, the effects of the present invention can be obtained even if the resistor other than the polycrystalline silicon film resistor may be employed.

Also, although the potential of the well 6 in the polycrystalline silicon film resistor shown in the structural cross-sectional view of FIG. 1 is connected to the negative electrodes of the respective batteries, the present invention can be achieved likewise even if the potential of the well 6 is connected to the positive electrodes of the respective batteries.

Further, even if the potential of the well 6 in the polycrystalline silicon film resistor shown in the structural cross-sectional view of FIG. 1 is connected to a lead-out terminal of the polycrystalline silicon film resistor, the present invention can be achieved likewise.

Furthermore, even if the potential of the well 6 in the polycrystalline silicon film resistor shown in the structural cross-sectional view of FIG. 1 is connected to a voltage source that does not influence the detecting operation of the batteries, the present invention can be achieved likewise.

Moreover, although the voltage detecting circuit 25 which is used in the battery voltage detecting circuit shown in FIG. 2 is set on the basis of a terminal Sense 2 which is on the negative terminal side of the battery 21, even if the voltage detecting circuit 25 is set on the basis of a terminal Sense 1 which is on the positive electrode side of the battery 21, the present invention can be achieved likewise. Also, although the voltage detecting circuit 26 is set on the basis of a terminal Sense 3 which is on the negative terminal side of the battery 22, even if the voltage detecting circuit 26 is set on the basis of a terminal Sense 2 which is on the positive electrode side of the battery 22, the present invention can be achieved likewise.

In addition, the number of batteries which are detected by the battery voltage detecting circuit shown in FIG. 2 is two, that is, the battery 21 and the battery 22, but even if the number of batteries is three or more, the present invention can be achieved likewise.

As described above, according to the present invention, in the battery voltage detection, there are effects that the influence such as the variation of the VDD terminal voltage which is a power supply of the battery voltage detecting circuit or the VSS terminal voltage which is a common is eliminated, thereby being capable of surely detecting the battery voltage.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A battery voltage detecting circuit for detecting a voltage across each of two or more batteries connected in series, comprising: a voltage dividing circuit for dividing the voltage of each of the batteries by a given ratio and outputting divided voltages; a voltage detecting circuit for detecting each divided voltage and outputting a detection result; and a control circuit for outputting the detection result; wherein the voltage dividing circuit includes a resistor comprised of a semiconductor substrate, an insulating layer provided on the semiconductor substrate, a resistor film provided on the insulating layer, and an impurity well formed in the semiconductor substrate opposite the resistor film and having a conductivity type different from that of the semiconductor substrate, the impurity well being connected to a power supply voltage of the battery voltage detecting circuit.

2. A battery voltage detecting circuit according to claim 1; wherein a potential of the impurity well is equal to a potential of the resistor film.

3. A battery voltage detecting circuit according to claim 2; wherein the resistor film comprises a polycrystalline silicon film.

4. A battery voltage detecting circuit according to claim 1; wherein the resistor film comprises a polycrystalline silicon film.

5. A battery voltage detecting circuit according to claim 1; wherein the voltage detecting circuit comprises a comparator for comparing a respective divided voltage with a reference voltage.

6. A battery voltage detecting circuit comprising: two or more batteries connected in series; two or more voltage dividing circuits connected to respective ones of the batteries for dividing the voltage of each battery and outputting a divided voltage; and a voltage detecting circuit for comparing each divided voltage with a reference voltage and outputting a detection result; wherein the voltage dividing circuits include a resistor comprised of a semiconductor substrate, an insulating layer provided on the semiconductor substrate, a resistor film provided on the insulating layer, and an impurity well formed in the semiconductor substrate opposite the resistor film and having a conductivity type different from that of the semiconductor substrate.

7. A battery voltage detecting circuit according to claim 6; wherein the impurity well is connected to a power supply voltage of the battery voltage detecting circuit.

8. A battery voltage detecting circuit according to claim 6; further comprising a control circuit for outputting the detection result.

9. A battery voltage detecting circuit according to claim 6; further comprising a control circuit for outputting the voltage detection result as a control signal.

10. A battery voltage detecting circuit according to claim 6; wherein a potential of the impurity well is equal to a potential of the resistor film.

11. A battery voltage detecting circuit according to claim 6; wherein the resistor film comprises a polycrystalline silicon film.

\* \* \* \* \*